(12) United States Patent
Peters et al.

(10) Patent No.: US 11,860,005 B2
(45) Date of Patent: Jan. 2, 2024

(54) POSITION DETECTOR, DOOR OPENING DETECTION DEVICE AND ASSOCIATED METHOD

(71) Applicants: IFOTEC, Voiron (FR); RIDGEMOUNT TECHNOLOGIES LTD, Bicester (GB)

(72) Inventors: Christopher Peters, Aylesbury (GB); Mark Limbert, Towcester (GB); Pierre Bonomini, Voiron (FR); Christian Sillans, La Frette (FR); Gilles Billet, Voiron (FR)

(73) Assignees: IFOTEC, Voiron (FR); RIDGEMOUNT TECHNOLOGIES LTD, Bicester (GB)

( * ) Notice: Subject to any disclaimer, the term of this patent is extended or adjusted under 35 U.S.C. 154(b) by 420 days.

(21) Appl. No.: 17/294,076

(22) PCT Filed: Nov. 8, 2019

(86) PCT No.: PCT/FR2019/052664
§ 371 (c)(1),
(2) Date: May 14, 2021

(87) PCT Pub. No.: WO2020/099765
PCT Pub. Date: May 22, 2020

(65) Prior Publication Data
US 2021/0404794 A1    Dec. 30, 2021

(30) Foreign Application Priority Data
Nov. 14, 2018  (FR) ...................................... 1860470

(51) Int. Cl.
*G01D 5/28* (2006.01)
*G01D 5/30* (2006.01)
*G02B 6/38* (2006.01)

(52) U.S. Cl.
CPC ............... *G01D 5/285* (2013.01); *G01D 5/30* (2013.01); *G02B 6/3873* (2013.01)

(58) Field of Classification Search
None
See application file for complete search history.

(56) References Cited

U.S. PATENT DOCUMENTS

| 4,432,599 A * | 2/1984 | McMahon | G01D 5/268 250/227.12 |
| 4,738,527 A * | 4/1988 | McBrien | G01D 5/268 356/480 |

(Continued)

FOREIGN PATENT DOCUMENTS

| DE | 39 18 640 A1 | 12/1990 |
| DE | 10 2014 221986 A1 | 5/2016 |
| EP | 2 80 6251 A2 | 11/2014 |

OTHER PUBLICATIONS

Mar. 17, 2020 Search Report issued in International Patent Application No. PCT/FR2019/052664.

*Primary Examiner* — Fekadeselassie Girma
(74) *Attorney, Agent, or Firm* — Oliff PLC

(57) ABSTRACT

The position detector of an object includes a body defining an input receiving an optical fibre delivering a light signal, and an output delivering a signal representative of the position of the object. A mirror is mounted to move between first and second positions in the body with respect to the input. The first position or the second position ensures transmission of the light signal from the input to the output. The other of the first position and the second position prevents transmission of the light signal to the output. A spring is mounted in the body in order to place the mirror in the first position. A tip is movable relative to the body (Continued)

between a first position and a second position along a direction of movement and is intended to cooperate with the object to be monitored.

10 Claims, 1 Drawing Sheet

(56) References Cited

U.S. PATENT DOCUMENTS

| | | | |
|---|---|---|---|
| 5,747,793 A * | 5/1998 | Sundburg | G01L 11/025 |
| | | | 250/227.14 |
| 6,778,716 B1 * | 8/2004 | Stevens | G01D 5/285 |
| | | | 385/12 |
| 10,001,367 B2 | 6/2018 | Anderson | |
| 10,651,847 B2 | 5/2020 | Peukert et al. | |
| 10,732,023 B2 * | 8/2020 | Mastrianni | G01G 19/12 |
| 10,746,378 B2 * | 8/2020 | Bachman | F21V 14/08 |
| 11,493,695 B2 * | 11/2022 | Stewart | G02B 6/3508 |
| 2014/0347674 A1 * | 11/2014 | Anderson | G01D 5/268 |
| | | | 356/614 |
| 2017/0321801 A1 * | 11/2017 | Peukert | H03K 17/968 |

* cited by examiner

POSITION DETECTOR, DOOR OPENING DETECTION DEVICE AND ASSOCIATED METHOD

BACKGROUND OF THE INVENTION

The invention relates to an object position detector, a door opening detection device and a method using such a detector or detection device.

STATE OF THE ART

In many areas, it is particularly advantageous to know the position of an object that can move between two distinct positions, for example a door or window that can be either open or closed.

On a door, it is known to install an electrical contactor which can be of capacitive, inductive or magnetic type in order to distinguish an electrical quantity which varies between an open and a closed door.

This solution is interesting because it is cheap and easy to install in the residential sector where technical constraints are low. However, it appears that in many conditions, such a detector configuration is very difficult to implement because it requires that a building and each of the doors and windows that must be monitored be electrically powered.

There is then a problem of power supply to the sensor and of processing the signal supplied by the sensor to the control station.

It is also known to use position detectors that use an optical signal. Typically, the sensor has a light source that is supplied with power. The sensor is associated with a light detector which receives the light signal from the light source. The detector is also supplied with power.

The movement of the door can be detected when it results in the light sensor stopping receiving the light signal. Conventionally, the sensor is mounted on the moving part while the light source is mounted stationary. The reverse is also true. Finally, it is possible to arrange the light source and the sensor in a fixed way so that the movement of the door interrupts the reception of the light signal.

Here again, it appears that it is necessary to supply power to the light source and the sensor associated with each door to be monitored.

Such a solution is not feasible when the door whose position is to be known is located at a great distance from the control station and especially when the door is not located near a voltage source.

Such a solution is unthinkable when a very large number of doors must be monitored, as it implies a significant power consumption to power the detectors, regardless of the technology used. The same is true when the detector must be installed in a confined space such as an enclosure designed to receive explosive or flammable materials.

OBJECT OF THE INVENTION

It is an object of the invention to provide a passive detection device that can be more easily used in a variety of configurations.

We tend to solve this need by means of an object position detector comprising:
 a body defining an inlet for receiving an optical fiber delivering a first light signal,
 an output delivering a signal representative of the position of the object to be monitored.
 The position detector is remarkable in that it comprises:
 a mirror mounted inside the body and movable relative to the input between a first position and a second position, the first position or the second position ensuring transmission of the light signal from the input to the output to form a light signal representative of the position of the object, the other position between the first position and the second position preventing transmission of the light signal to the output
 a first spring mounted in the body and configured to place the mirror in the first position in the absence of stress,
 an end piece movable relative to the body between a first position and a second position along a direction of movement and designed to cooperate with the object to be monitored, the end piece being mechanically linked to the mirror so that
 when the end piece is in the first position, the mirror is in the first position,
 when the end piece is in the second position, the mirror is in the second position,
 the movement of the end piece from the first position to the second position leads to the movement of the mirror from the first position to the second position.

In one embodiment, the mirror is mounted for translational movement between the first position and the second position.

Advantageously, a second spring is mounted on the mirror and the end piece, the second spring being configured to move the end piece toward the first position.

In a particular embodiment, the detector includes a system for securing the body to a fixed point, the system for securing including two protruding members surrounding the body, the two protruding members being spaced apart in a direction connecting the inlet and the end piece, at least one of the two protruding members being removably mounted relative to the body.

It is advantageous to provide that the input forms the output so that the light signal at the output of the position detector passes through the optical fiber.

In a further development, the detector comprises a stop projecting from the end piece, the stop being adjustably mounted so as to modulate the extension of the stop relative to the end piece along the direction of travel.

The invention also relates to an enclosure provided with an opening which is closed by the object, the enclosure comprising the position sensor according to one of the preceding embodiments, the position detector being arranged such that:
 when the object is in the first position, the end piece is in the first position,
 when the object is in the second position, the end piece is in the second position,
 the movement of the object from the first position to the second position leads to the movement of the end piece from the first position to the second position.

Preferably, the enclosure is an optical connection node comprising a plurality of optical fibers.

Another object of the invention is a method for detecting the position of an object that is easy to implement.

The method for detecting is remarkable in that it comprises the following steps:
 Providing a position detector according to any of the preceding configurations,
 Moving the object from the first position to the second position causing the mirror to move from the first position to the second position and causing the output signal to change.

BRIEF DESCRIPTION OF THE DRAWINGS

Other advantages and features will become more clearly apparent from the following description of particular embodiments and implementation modes of the invention given for non-restrictive example purposes only and represented in the appended drawings, in which.

DESCRIPTION OF A PREFERENTIAL EMBODIMENT OF THE INVENTION

Figure 1:
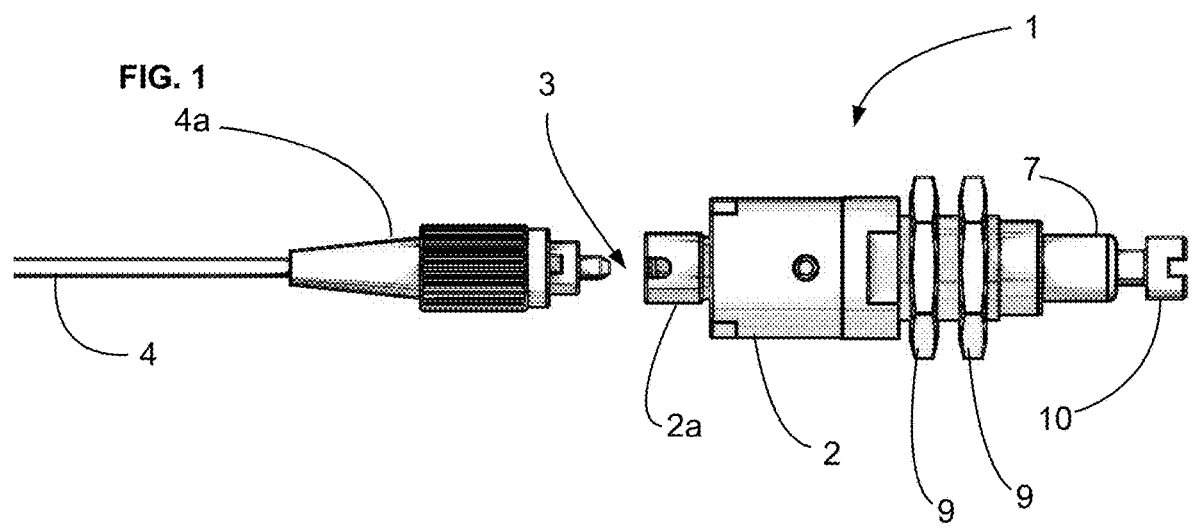
FIG. 1 shows a schematic side view of an object position detector and an optical fiber prior to its installation in the position detector according to an embodiment of the invention.

FIG. 1 illustrates a position detector 1 provided with a body 2 defining an input 3 which will receive an optical fiber 4. The optical fiber 4 delivers a light signal which travels through the position detector 1. The position detector 1 delivers an output signal representative of the position of an associated object. The output signal is a light signal.

The body 2 advantageously comprises a head 2a which cooperates with a coupling member 4a mounted on the optical fiber 4.

The position detector 1 comprises a mirror 5 mounted movably within the body 2 and relative to the inlet 3. The mirror 5 moves between a first position and a second position. The first position or the second position authorizes transmittal of the light signal from the input 3 to the output to provide a signal representative of the position of the object. The other position among the first position and the second position prevents transmission of the light signal to the output. The position of the object is defined by whether or not a light signal is provided.

With such a configuration, detecting or not an output signal present at the output of the position detector 1 makes it possible to determine whether the object to be monitored is in the first position or in the second position.

The mirror 5 moves between two positions and thus provides an output signal that corresponds to the input signal. In this way, the position detector 1 can be devoid of a light source. This configuration allows the light source to be moved to a great distance and in particular to an area that is supplied with power, which may not be the case for the area that includes the position detector. The detector is advantageously devoid of a light signal sensor.

The use of a mirror 5 makes it possible to form a passive device which does not comprise a light source, nor a light sensor what allows its installation without using a source of electric current.

Advantageously, the mirror 5 has a transmission line 5a that contacts the optical fiber 4 and a reflector 5b. The light signal is reflected on the reflector 5b from the transmission line 5a. It is advantageous to make the transmission line 5a and the reflector 5b mobile to better realize transmission or not of the output signal. Advantageously, the transmission line 5a is formed by an optical fiber. An optical fiber is a wire whose core, which is very thin, is advantageously made of glass or plastic and has the property of conducting light. The core is covered by a protective sheath.

A first spring 6 is mounted in the body 2. The first spring 6 is configured to place the mirror 5 in the first position. In the absence of a bias, the mirror 5 in the second position is returned to the first position.

The detector 1 also includes an end piece 7 that can be moved relative to the body 2 between a first position and a second position in a direction of movement. The end piece 7 is designed to cooperate with the object to be monitored. The end piece 7 projects from the body 2 and advantageously slides in the body so as to move the mirror 5.

The end piece 7 is mechanically connected to the mirror 5 so that:
when the end piece 7 is in the first position, the mirror 5 is in the first position,
when the end piece 7 is in the second position, the mirror 5 is in the second position,
displacement of the end piece 7 from the first position to the second position leads to displacement of the mirror 5 from the first position to the second position.

Advantageously, the mirror 5 is mounted so that it can only move in translation between the first position and the second position. Using a mirror mounted only with translational movement makes it possible to fabricate a position detector 1 which is compact and easy to realize as well as more resistant compared to a configuration where the mirror 5 is mounted rotatably.

Figure 2:
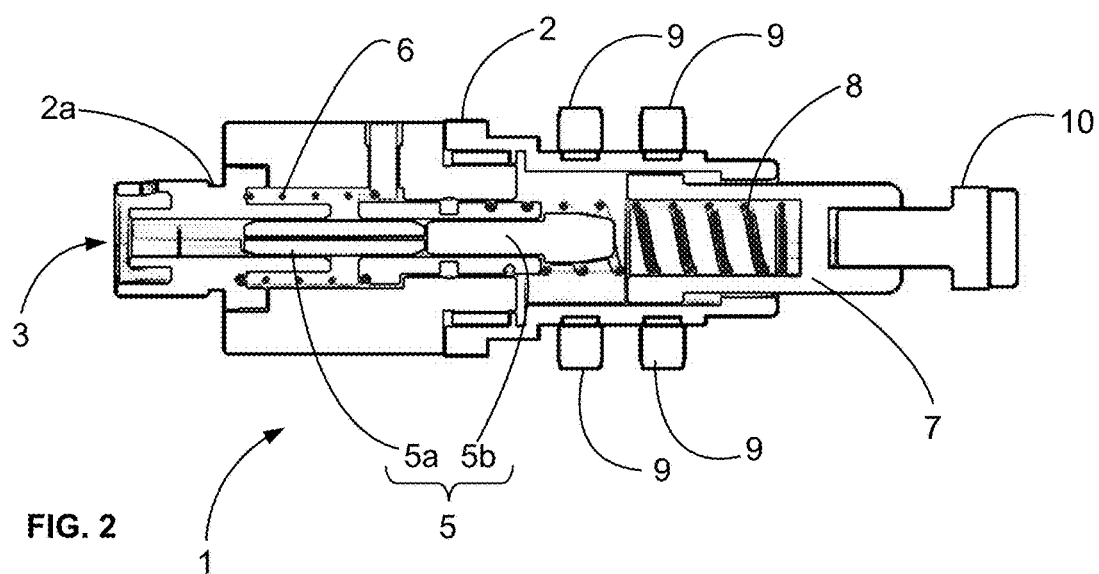
FIG. 2 schematically represents, in longitudinal section, a position detector according to an embodiment of the invention, the end piece being in the first position.

In the embodiment illustrated in FIG. 2, a second spring 8 is mounted on the mirror 5 and the end piece 7. The second spring 8 is configured to move the end piece 7 to the first position. It is particularly advantageous to provide the mirror 5 is not mounted directly on the end piece 7. Indeed, when the mirror 5 is directly fixed to the end piece 7, all the shocks received by the end piece 7, for example when the door violently meets the end piece 7, result in as many shocks on the mirror 5 which can end up deteriorating or coming into contact with other components of the detector 1 or the optical fiber 4. It is then advantageous to install a resilient element, for example a second spring, which is mounted between the mirror 5 and the end piece 7. Advantageously, the second spring is mounted in the body 2.

A stress applied to the end piece 7 to move it from the first position to the second position causes a stress to be applied to the mirror to move the mirror from the first position to the second position. The resilient means 8 absorbs some of the initial stress to have the mirror move without significant stress on the contact area between the fiber and the mirror.

The hardness of the elastic element 8 is chosen so that it does not prevent the movement of the mirror 5 by completely absorbing the movement of the end piece 7. It is important to avoid using a material that is too soft. According to the same logic, one should avoid using a material that is too rigid and whose deformation will be zero or low, which would result in the configuration without the elastic element 8.

The first and second springs 6 and 8 are arranged to apply opposing forces on the mirror 5. However, it is particularly advantageous that the force exerted by the second spring 8 is greater than the force exerted by the first spring 6 in order to move the mirror 5 away from the optical fiber 4 and thus detect more easily, for example, an opening of the door. When the end piece 7 moves, the use of a spring 8 having a stiffness greater than the stiffness of the spring 6 makes it possible to bring the mirror 5 closer to the fiber 4 and to place it in a reflective position, preferably an optimal reflective position. Once the mirror 5 is in contact with the fiber 4, the overtravel of the end piece 7 or any element to be monitored is absorbed by the springs to avoid applying too much stress to the interface between the mirror 5 and the fiber 4 and thus avoid premature wear of the mirror 5.

It is advantageous to have a resilient element 8 whose stiffness is in the same range as that of the first spring 6.

Preferably, the second spring 8 is less than ten times stiffer than the first spring 6, even more preferably less than five times stiffer and even more preferably less than two times stiffer.

Advantageously, the first spring 6 and the elastic element 8 are separated by the mirror 5.

Preferably, in the absence of a bias, the first spring 6 moves the mirror 5 into a position where the light signal supplied to the input 3 does not reach the output. It is also advantageous to provide that when the optical fiber 4 is installed in the input 3, the mirror 5 comes to abut against the optical fiber and not against another stop of the detector when the mirror is in the second position.

In other words, in the absence of a bias, the first spring 6 moves the mirror 5 at a distance from the optical fiber 4 so that when the end piece 7 is moved from the first position to the second position, the mirror 5 moves from the first position to the second position which is defined by the contact between the mirror 5 and the optical fiber 4. This configuration allows a better adaptability of the second position with respect to the embedding of the optical fiber 4 in the detector 1.

It should also be noted that the mirror 5 does not force against the optical fiber 4, the force applied to the optical fiber 4 is defined by the stiffness of the second spring 8.

In the illustrated embodiment, the mirror 5 is arranged so that the input 3 receiving the light signal from the optical fiber 4 sends the signal back to the input which thus forms the output. In other words, the mirror 5 is arranged to send the output signal back into the optical fiber 4.

The reflecting plane of the mirror 5 is arranged perpendicular to the longitudinal axis of the optical fiber 4 or substantially perpendicular to the longitudinal axis of the optical fiber 4. Advantageously, the contact between the transmission line 5a and the optical fiber 4 is of the APC type (Angled Physical Contact).

Preferably, the optical fiber 4 and the transmission line 5a each have a face that is not perpendicular to the longitudinal axis of the optical fiber 4. Advantageously, the angular offset between the end plane of the optical fiber 4 and the transmission line 5a is offset by an angle of between 5° and 12° relative to the plane perpendicular to the longitudinal axis of the optical fiber 4. Thus, the conjugate deviations of the incident and reflected beams allow the attenuation to increase very quickly as a function of the distance between the faces of the fiber 4 and the transmission element 5a. This attenuation causes the incident and reflected beams to diverge, as the Fresnel reflection inherent in fiber 4 is not conducted into the fiber due to the face angle.

In some embodiments, the signal reflected by the mirror 5 can be further attenuated by rotation of the mirror 5 relative to the optical fiber 4 combined with longitudinal displacement of the mirror 5 or/and by an anti-reflective treatment of the chamber walls containing the mirror 5.

It is further conceivable to provide a particular embodiment in which lenses provided with anti-reflective treatments are inserted to perform the same function and without contact. Preferably, the lenses are configured to form expanded beams, the lenses moving as a function of the position of the end piece 7 which modifies the shape of the beam to discriminate between at least two positions of the end piece 7.

The use of the optical fiber 4 to receive the optical output signal increases the compactness of the detector 1. The other end of the optical fiber is provided with a device that generates a light signal and is also capable of detecting the light signal that comes from the optical fiber 4. Thus, a user arranged at the other end of the optical fiber 4 emits a light signal that reaches the position detector 1. Depending on the position of the end piece 7 a light signal is sent back to the output or not which allows the user to know the position of the end piece 7 and thus the position of the object cooperating with the end piece 7.

The position detector 1 provides an output signal representative of the position of the end piece 7 which cooperates with an object to be monitored, for example a door, a window or any other object which can close an opening. Preferably, the position detector 1 is mounted stationary and the object moves, causing the end piece to move. Alternatively, the detector is mounted on the moving object and the end piece 7 cooperates with the stationary element. It is also possible to provide that the object to be monitored is mobile and that the position detector is also mounted on a mobile element.

In order to facilitate its installation, the detector 1 advantageously comprises a system for fixing the body 2 to a hooking device. The system for fixing comprises two projecting elements 9 surrounding the body 2. The two projecting elements 9 are spaced apart along a direction connecting the inlet 3 and the end piece 7. At least one of the two projecting elements 9 is removably mounted with respect to the body 2.

Installation of the detector 1 is done by inserting the detector into a through hole larger than the size of the body 2 and smaller than the size of the two protruding elements 9. By clamping the two protruding elements 9, the sensor 1 is firmly installed and its end piece 7 will cooperate with the object whose position is to be monitored.

Advantageously, one or both of the protruding elements 9 are screwed to the body 2 to modulate the distance between the two protruding elements 9 as well as the clamping force of the detector on its support.

Advantageously, the detector 1 includes a stop 10 mounted on the end piece 7. The stop 10 protrudes from the end piece 7 so that the stop 10 contacts the object to be monitored. The stop 10 is configured to extend more or less from the surface of the end piece 7 so as to accommodate the depression of the end piece 7 into the body 2 as the object moves. For example, the stop is rotatably mounted on a thread to adjust the extension of the stop 10 relative to the end piece 7.

Such a position detector 1 is particularly advantageous for tracking opening of a door, window and/or any hole such as an access hatch cover or a manhole cover in an enclosure that is not powered by electricity. It is contemplated that the position detector could be installed on a manhole cover, or on a door of a submersible or unsinkable vessel. It has been found that it is particularly complicated to make holes in the wall of a ship. It is therefore particularly advantageous to use this technology, which avoids drilling holes in the wall of a ship.

It is particularly advantageous to use such a detector in an optical connection node that has several optical fibers and is often devoid of electrical power.

Such a detector is also particularly advantageous for monitoring the opening and closing of an enclosure intended to receive explosive and/or flammable materials and for which the use of a current-powered detector is prohibited or much more difficult to implement.

Such a detector is also particularly advantageous for monitoring the opening and closing of a door, window or hatch that is in a wet or submerged environment.

In the illustrated embodiment, the detector is passive, i.e., it has no power supply. The detector is connected to an optical fiber 4 which provides a light signal. This same light signal is re-emitted or not in the optical fiber, which makes it possible to discriminate the position of the end piece 7.

The use of an optical fiber 4 associated with a light signal is particularly advantageous because the light source can be several hundred meters or even tens of kilometers away from the detector, for example over 10 kilometers.

It also appears that the signal indicating the position of the end piece and thus the position of the object to be monitored is an optical signal, which makes it possible to easily manage a very large number of objects by multiplexing the different signals coming from multiple detectors.

The operation of the detector can be presented as follows. The detector used is a detector according to one of the different embodiments presented above.

The object is moved from the first position to the second position, which causes a displacement of the end piece 7 from the first position to the second position and thus a displacement of the mirror 5 from the first position to the second position. The movement of the mirror 5 causes a change in the output signal. The output signal in the form of light output signal may be extinguished by the movement. Alternatively, the light signal may appear due to the displacement.

As mentioned above, when the object moves from the second position to the first position, the end piece also moves from the second position to the first position as does the mirror. The state of the output signal changes.

For example, during an intervention, an enclosure is opened which modifies the state of the output signal delivered by the detector 1. The change of state can be associated with a time marker. Once the intervention is over, the enclosure is closed again, which modifies the state of the output signal delivered by the detector 1. The change of state can be associated with a time marker. The intervention time is the time between the two changes of state. This makes it possible to know the exact duration of the intervention. This also makes it possible to detect whether the enclosure has not been closed properly.

As the detector is not powered by electricity and is equipped with a movable mirror installed in the body, the detector is a robust detector.

Advantageously, when the object is in its expected position, e.g. the door, the window and generally the opening is closed, the detector emits an output light signal. The absence of a light signal indicates that the opening is open or that the detector or light source is malfunctioning.

Advantageously, the position detector 1 is sealed against dust or liquids once the optical fiber 4 is installed in the body 2.

The invention claimed is:

1. A position detector for monitoring position of an object comprising:
   a body defining an input designed to receive an optical fiber delivering a first light signal,
   an output delivering a signal representative of the position of the object to be monitored,
   a mirror mounted so as to be movable inside the body and relative to the input between a first position and a second position, the first position or the second position ensuring the transmission of the light signal from the input to the output to form a light signal representative of the position of the object, the other position among the first position and the second position preventing the transmission of the light signal to the output,
   a first spring mounted in the body and configured to place the mirror in the first position,
   an end piece movable relative to the body between a first position and a second position along a direction of movement and designed to cooperate with the object to be monitored, the end piece being mechanically connected to the mirror so that:
     when the end piece is in the first position, the mirror is in the first position,
     when the end piece is in the second position, the mirror is in the second position,
     displacement of the end piece from the first position to the second position causes the mirror to move from the first position to the second position, so that the mirror comes to rest against the optical fiber in the position ensuring the transmission of the light signal.

2. The position detector according to claim 1 wherein the mirror is mounted for translational movement between the first position and the second position.

3. The position detector according to claim 1 wherein a second spring is mounted on the mirror and the end piece, the second spring being configured to move the end piece towards the first position.

4. The position sensor according to claim 1 comprising a system for fixing the body to a hooking member, the system for fixing comprising two protruding elements surrounding the body, the two protruding elements being spaced apart along a direction connecting the inlet and the end piece, at least one of the two protruding elements being mounted removable with respect to the body.

5. The position detector according to claim 1 wherein the input forms the output so that the light signal output from the position detector passes through the optical fiber.

6. The position detector according to claim 1 comprising a stop projecting from the end piece, the stop being mounted adjustable so as to modulate the extension of the stop relative to the end piece according to the direction of movement.

7. An enclosure comprising the object and the position detector according to claim 1, the position detector being arranged so that:
   when the object is in the first position, the end piece is in the first position,
   when the object is in the second position, the end piece is in the second position,
   moving the object from the first position to the second position causes the end piece to move from the first position to the second position.

8. The enclosure according to claim 7 wherein the object is a door, window or hatch.

9. The enclosure according to claim 8 wherein the enclosure is an optical connection node comprising a plurality of optical fibers.

10. A method for detecting the position of an object, comprising the following steps:
    providing a position detector according to claim 1,
    moving the object from the first position to the second position causing the mirror to move from the first position to the second position and causing the output signal to change.

* * * * *